US010307867B2

(12) United States Patent
Hollinger et al.

(10) Patent No.: US 10,307,867 B2
(45) Date of Patent: Jun. 4, 2019

(54) LASER FIBER ARRAY FOR SINGULATING SEMICONDUCTOR WAFERS

(71) Applicants: Franz Hollinger, Oberreidenbach (DE); Karel Maykel Richard Van Der Stam, Apeldoorn (NL); Dick Verhaart, Eindhoven (NL); Guido Martinus Henricus Knippels, Schijndel (NL)

(72) Inventors: Franz Hollinger, Oberreidenbach (DE); Karel Maykel Richard Van Der Stam, Apeldoorn (NL); Dick Verhaart, Eindhoven (NL); Guido Martinus Henricus Knippels, Schijndel (NL)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 951 days.

(21) Appl. No.: 14/533,204

(22) Filed: Nov. 5, 2014

(65) Prior Publication Data

US 2016/0121426 A1 May 5, 2016

(51) Int. Cl.
*B23K 26/06* (2014.01)
*B23K 26/067* (2006.01)
*B23K 26/364* (2014.01)
*H01L 21/67* (2006.01)
*B23K 103/00* (2006.01)

(52) U.S. Cl.
CPC ........ *B23K 26/364* (2015.10); *B23K 26/0676* (2013.01); *B23K 2103/56* (2018.08); *H01L 21/67092* (2013.01)

(58) Field of Classification Search
CPC .............. B23K 26/067; B23K 2201/40; B23K 26/0604; B23K 26/06; H01L 21/78

USPC ........... 219/121.68, 121.72, 121.75, 121.76; 257/E21.599

See application file for complete search history.

(56) References Cited

U.S. PATENT DOCUMENTS 4,694,153 A * 9/1987 Bejczy ................. G01B 11/028
250/202
5,272,309 A * 12/1993 Goruganthu ....... B23K 26/0604
219/121.63

(Continued)

FOREIGN PATENT DOCUMENTS

JP H05-104276 A 4/1993
JP H06-106377 A 4/1994

(Continued)

OTHER PUBLICATIONS

Notice of Preliminary Rejection dated Nov. 11, 2016 in corresponding Korean Patent Application No. 10-2015-0155247 (total 12 pages).

(Continued)

*Primary Examiner* — Dana Ross
*Assistant Examiner* — Lawrence H Samuels
(74) *Attorney, Agent, or Firm* — Ostrolenk Faber LLP

(57) ABSTRACT

An apparatus for cutting a substrate comprises first and second lasers, and first and second optical fibers each having an input end and an output end opposite to the input end, wherein the input ends of the first and second optical fibers are connected to the first and second lasers respectively. The output ends of the first and second optical fibers are movable relative to the substrate and are configured to image first and second laser beams onto the substrate simultaneously for cutting the substrate.

11 Claims, 3 Drawing Sheets

(56) References Cited

U.S. PATENT DOCUMENTS

| | | | | |
|---|---|---|---|---|
| 5,430,816 A * | 7/1995 | Furuya | ............... | B23K 26/067 385/33 |
| 5,676,866 A * | 10/1997 | in den Baumen | ..... | B23K 26/04 219/121.74 |
| 5,693,043 A * | 12/1997 | Kittrell | .............. | A61B 1/00096 606/15 |
| 6,037,564 A * | 3/2000 | Tatah | .................. | B23K 26/067 219/121.7 |
| 6,562,698 B2 * | 5/2003 | Manor | .............. | B23K 26/0604 257/E21.599 |
| 6,580,054 B1 * | 6/2003 | Liu | ...................... | B23K 26/032 219/121.68 |
| 6,605,799 B2 * | 8/2003 | Brandinger | ........ | B23K 26/0604 219/121.74 |
| 7,553,777 B2 | 6/2009 | Nagai et al. | | |
| 7,947,920 B2 | 5/2011 | Van Borkulo et al. | | |
| 2001/0035401 A1 * | 11/2001 | Manor | .............. | B23K 26/0604 219/121.72 |
| 2001/0045418 A1 * | 11/2001 | Brandinger | ........ | B23K 26/0604 219/121.74 |
| 2004/0042739 A1 * | 3/2004 | Maeno | ..................... | G02B 6/32 385/89 |
| 2005/0270542 A1 | 12/2005 | Sullivan et al. | | |
| 2005/0279736 A1 * | 12/2005 | Bruland | ...................... | B23K 26/0613 219/121.8 |
| 2006/0027886 A1 * | 2/2006 | Liu | ...................... | B23K 26/032 257/414 |
| 2006/0249816 A1 | 11/2006 | Li et al. | | |
| 2006/0256832 A1 * | 11/2006 | Volodin | ............. | G02B 27/0944 372/102 |
| 2008/0030867 A1 * | 2/2008 | Corem | ................. | G02B 3/0031 359/641 |
| 2008/0070378 A1 * | 3/2008 | Yeo | ................... | B23K 26/0604 438/460 |
| 2008/0121627 A1 * | 5/2008 | Bruland | ............ | B23K 26/0613 219/121.67 |
| 2008/0201954 A1 | 8/2008 | Meinschien | | |
| 2010/0252543 A1 * | 10/2010 | Manens | .............. | B23K 26/702 219/121.69 |
| 2010/0282720 A1 * | 11/2010 | Miyagawa | ................ | B41C 1/05 219/121.19 |
| 2011/0132884 A1 * | 6/2011 | Manens | .............. | B23K 26/0673 219/121.72 |
| 2011/0287607 A1 * | 11/2011 | Osako | ................ | B23K 26/0608 438/462 |
| 2012/0312970 A1 * | 12/2012 | Goebel | ..................... | F16P 1/02 250/216 |
| 2013/0025325 A1 * | 1/2013 | Piwczyk | ........... | H01L 21/67115 65/392 |
| 2013/0048843 A1 | 2/2013 | Miyagawa et al. | | |
| 2013/0273240 A1 * | 10/2013 | Holland | ................ | G02B 6/262 427/163.2 |

FOREIGN PATENT DOCUMENTS

| | | |
|---|---|---|
| JP | 2000-317661 A | 11/2000 |
| JP | 2000-323381 A | 11/2000 |
| JP | 2001-196665 A | 7/2001 |
| JP | 2004-526335 A | 8/2004 |
| JP | 2005-079497 A | 3/2005 |
| JP | 2006-108459 A | 4/2006 |
| JP | 2006-136904 A | 6/2006 |
| JP | 2006-263771 A | 10/2006 |
| JP | 2007-038226 A | 2/2007 |
| JP | 2007-129225 A | 5/2007 |
| JP | 2009-508689 A | 3/2009 |
| JP | 2013-043440 A | 3/2013 |
| JP | 2013-139039 A | 7/2013 |
| JP | 2013-184226 A | 9/2013 |
| JP | 2014-065288 A | 4/2014 |
| KR | 10-2006-0022982 | 3/2006 |
| KR | 2007-0036747 A | 4/2007 |
| KR | 10-2011-0089356 | 8/2011 |
| KR | 10-1161731 B1 | 7/2012 |
| KR | 10-2013-0014522 | 2/2013 |
| TW | 579436 B | 3/2004 |
| TW | 200711238 A | 3/2007 |
| TW | 200822202 A | 5/2008 |
| TW | 201206605 A1 | 2/2012 |
| WO | WO 02/094528 A1 | 11/2002 |
| WO | WO 2006/009818 A2 | 1/2006 |
| WO | WO 2013/043173 A1 | 3/2013 |

OTHER PUBLICATIONS

Notice of Preliminary Rejection dated May 19, 2017 in corresponding Korean Patent Application No. 10-2015-0155247 (total 10 pages).

Notice of Reasons for Rejection dated May 29, 2017 in corresponding Japanese Patent Application No. 2015-216494 (total 6 pages).

Taiwanese Office Action dated Aug. 22,2016 in corresponding Taiwanese Patent Application No. 104135165 (with English language transiation)(11 total pages).

* cited by examiner

LASER FIBER ARRAY FOR SINGULATING SEMICONDUCTOR WAFERS

FIELD OF THE INVENTION

The invention relates to the singulation of semiconductor wafers, and in particular, to the singulation of semiconductor wafers utilizing laser energy.

BACKGROUND AND PRIOR ART

Conventionally, a single laser beam has been used for the laser cutting of semiconductor wafers comprising a matrix of semiconductor chips. A laser singulation machine for the semiconductor industry typically uses one high power laser. Usually, q-switched solid-state lasers with infrared, green or ultraviolet emissions are used. The laser beam is focused onto the semiconductor wafer via mirrors and lenses to melt its material and separate its semiconductor chips. The laser power is adjusted by an external attenuator.

If multiple laser beams are to be used simultaneously for cutting a semiconductor wafer, the laser beam may be split into multiple beams from a single laser power source by means of a diffraction optical element ("DOE") system. Beam splitters and other free-space optics are generally incorporated in such a DOE system to obtain a desired laser-splitting outcome.

Examples of existing singulation processes include grooving, dicing and stealth dicing. During grooving, a groove is formed on the semiconductor wafer to remove only a low-k top layer of the wafer, and the wafer is only separated in a subsequent step. In a dicing process, the laser beam ablates sufficient semiconductor wafer material to cut fully through a thickness of the wafer. During stealth dicing, the laser beam is focused in-between opposing surfaces of the semiconductor wafer to melt the wafer while avoiding surface damage to the wafer. For laser cutting using any of the above singulation processes, multiple passes of a laser beam for cutting may be required due to different wavelengths, pulse energies, repetition frequencies or pulse lengths, or different polarizations per beam. However, reliance on a single power source restricts the cutting efficiency of a laser singulation apparatus.

In relation to grooving, it has been recognized that single-pass grooving is not possible with a single high power laser. The grooving process requires different laser frequencies and pulse energies which must be applied during different passes. More specifically, a "trenching" pass typically requires high repetition frequency and low pulse energy but good spatial overlap between consecutive pulses, whereas the "grooving" pass requires the removal of a lot of material, such that high pulse energy and low repetition rate but larger distance between consecutive pulses is required. This two-pass process significantly slows down the singulation throughput of the machine Moreover, DOE systems are generally expensive and require regular preventive maintenance. Diffractive beam splitters that are used in current DOE systems need sophisticated beam delivery optics with many lenses and a spatial filter. With the use of only a single high-power laser, the lifetime of the optical elements is limited.

Since the number of laser beams and the properties of each laser beam are essentially fixed by the optical path design of the DOE system, the laser beams cannot easily be controlled independently of each other because they are all derived from the same laser source. It would thus be beneficial to be able to independently control each laser beam so as to avoid the aforesaid shortcomings of the prior art when performing laser singulation.

SUMMARY OF THE INVENTION

It is thus an object of the invention to seek to provide a laser singulation apparatus which is capable of generating a plurality of laser beams simultaneously and that may be utilized with greater flexibility as compared to the prior art.

Accordingly, the invention provides an apparatus for cutting a substrate, the apparatus comprising: first and second lasers: and first and second optical fibers, each having an input end and an output end opposite to the input end, the input ends of the first and second optical fibers being connected to the first and second lasers respectively; wherein the output ends of the first and second optical fibers are movable relative to the substrate and are configured to image first and second laser beams onto the substrate simultaneously for cutting the substrate.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

Examples of laser singulation apparatus in accordance with the invention will now be described with reference to the accompanying drawings, in which.

DETAILED DESCRIPTION OF THE PREFERRED EMBODIMENT OF THE INVENTION

Figure 1:
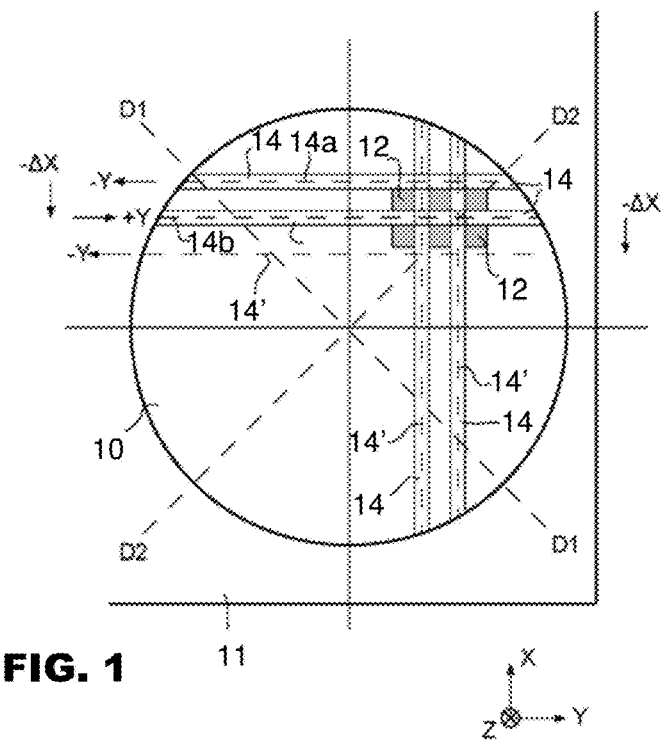
FIG. 1 is a plan view of a semiconductor wafer comprising a matrix of semiconductor chips to be singulated.

FIG. 1 is a plan view of a semiconductor wafer 10 comprising a matrix of semiconductor chips 12 to be singulated by cutting. The semiconductor wafer 10 is supported on a movable wafer platform 11. Various cutting lines 14 are illustrated on the surface of the semiconductor wafer 10. For reference purposes, FIG. 1 also shows longitudinal, central axes 14' of a number of cutting lines 14.

These cutting lines 14 run in an X-Y grid pattern on a generally horizontal plane between semiconductor chips 12 that are distributed in a matrix arrangement on the surface of the semiconductor wafer 10. There will generally be many such semiconductor chips 12 on a typical semiconductor wafer 10, but only a few have been illustrated here for simplicity and clarity. FIG. 1 depicts a longitudinal cut followed by a lateral step approach to dicing the semiconductor wafer 10 along multiple, successive cutting lines 14 in a particular direction (in this case ±Y).

The following is an example of a method by which the dicing process may be conducted. The semiconductor wafer 10 is diced along cutting line 14a by scanning a laser beam in the −Y direction. In practice, such relative motion is achievable by using an actuator system (not shown) to move the wafer platform 11 in the +Y direction.

After completing a dicing run along cutting line 14a, the actuator system is actuated to step the wafer platform 11 in the +X direction by an amount ΔX. As a result, the laser beam will effectively be shifted relative to the semiconductor wafer 10 by an amount −ΔX. The semiconductor wafer 10 is now diced along cutting line 14b by scanning the laser beam in the +Y direction. In practice, this relative motion is achievable by operating the actuator system to move the wafer platform 11 in the −Y direction.

In the apparatus which is schematically depicted in FIG. 1, two separate linear motors (not depicted) are operable to independently drive the wafer platform 11 along orthogonal D1 and D2 axes, which subtend at angles of 45° with respect to the X and Y axes. As such, motion of the wafer platform 11 in the X and/or Y axis involves concurrent driving along the D1 and D2 axes.

Figure 2:
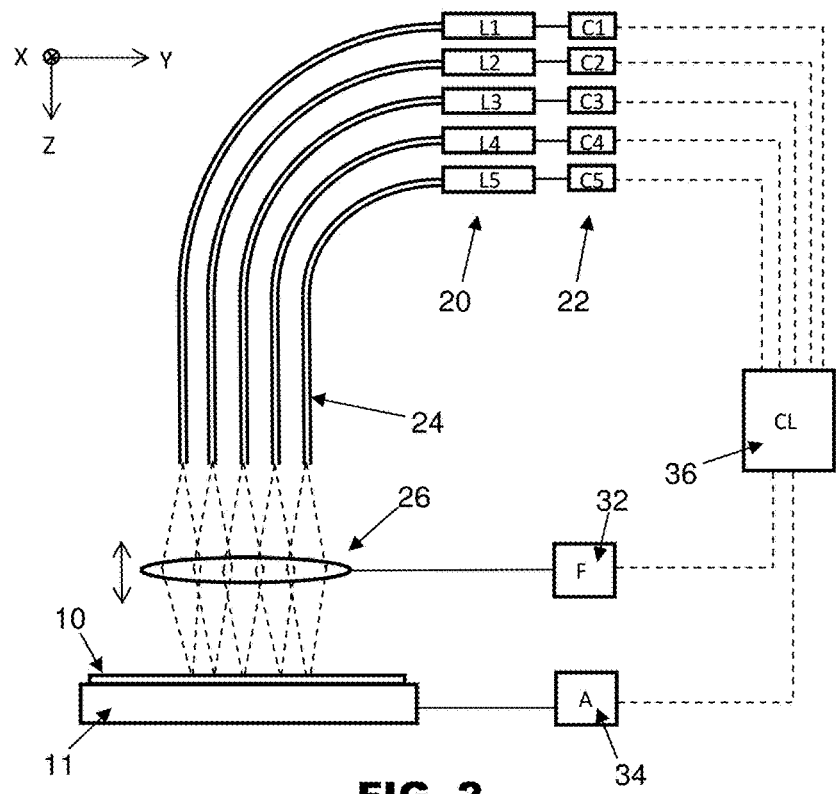
FIG. 2 is a schematic illustration of a laser fiber array according to a first preferred embodiment of the invention for generating multiple laser beams.

FIG. 2 is a schematic illustration of a laser fiber array 20 according to a first preferred embodiment of the invention for generating multiple laser beams to cut a substrate, such as a semiconductor wafer 10. In the illustrated embodiment, multiple lasers L1-L5 are configured in such a way that their combined output forms a linear array of laser spots on the semiconductor wafer 10. Although only five lasers L1-L5 are shown for simplicity, more or fewer lasers may be incorporated into the laser fiber array 20. For instance, first and second lasers may be sufficient, depending on the desired result.

Optical fibers 24 are connected to the multiple lasers L1-L5. Each optical fiber 24 has an input end that is connected to a laser L1-L5 and an output end that is configured to output and image a laser beam onto the semiconductor wafer 10. The output ends of the optical fibers 24 may be linearly arranged to obtain the linear array of laser spots, and laser beams that are output from ends of the fibers 24 are imaged onto the surface of the semiconductor wafer 10 via a lens assembly 26. The lens assembly 26 has a certain optical magnification or demagnification factor M, which results in a linear array of high-intensity laser spots on the surface of the semiconductor wafer 10 that is supported on the wafer platform 11. The optical fibers 24 are movable relative to the semiconductor wafer 10 to move the laser spots used for cutting the wafer.

Each laser L1-L5 is separately controlled by a respective controller C1-C5 of a controller system. Operating parameters used with the lasers L1-L5, such as the power, pulse duration and activation/deactivation of each laser L1-L5, are controllable such that the operation of each laser is independent from the operation of the other lasers. The lens assembly 26 may be detuned in the Z-direction from optimum imaging conditions by adjusting it by means of an image controller 32 so as to apply a certain amount of defocus to a pattern which is imaged onto the semiconductor wafer 10. A horizontal position of the semiconductor wafer 10 along the x-y axis is controlled by a position controller 34 that is operatively connected to the wafer platform 11. Additionally, a master controller 36 controls the whole singulation process of the semiconductor wafer 10 as described with reference to FIG. 1.

There is flexibility in the use of different types of laser combinations to be included in the laser fiber array 20. In the case of infrared laser singulation machines, a bundle of low-power pulsed fiber lasers may be used. On the other hand, for green laser singulation machines, a bundle of low-power frequency doubled DPSS q-switch lasers may each be coupled into a passive optical fiber. For grooving applications, a bundle of ultraviolet lasers may be coupled into respective passive fibers for a so-called trenching pass. Further, one or more infrared fiber lasers may be added to the bundle for forming an inner groove on the wafer after the trenching pass. The whole laser fiber array 20 may be imaged onto the semiconductor wafer 10 via an objective lens assembly 26 with a dual-wavelength anti-reflection coating.

Figure 3:
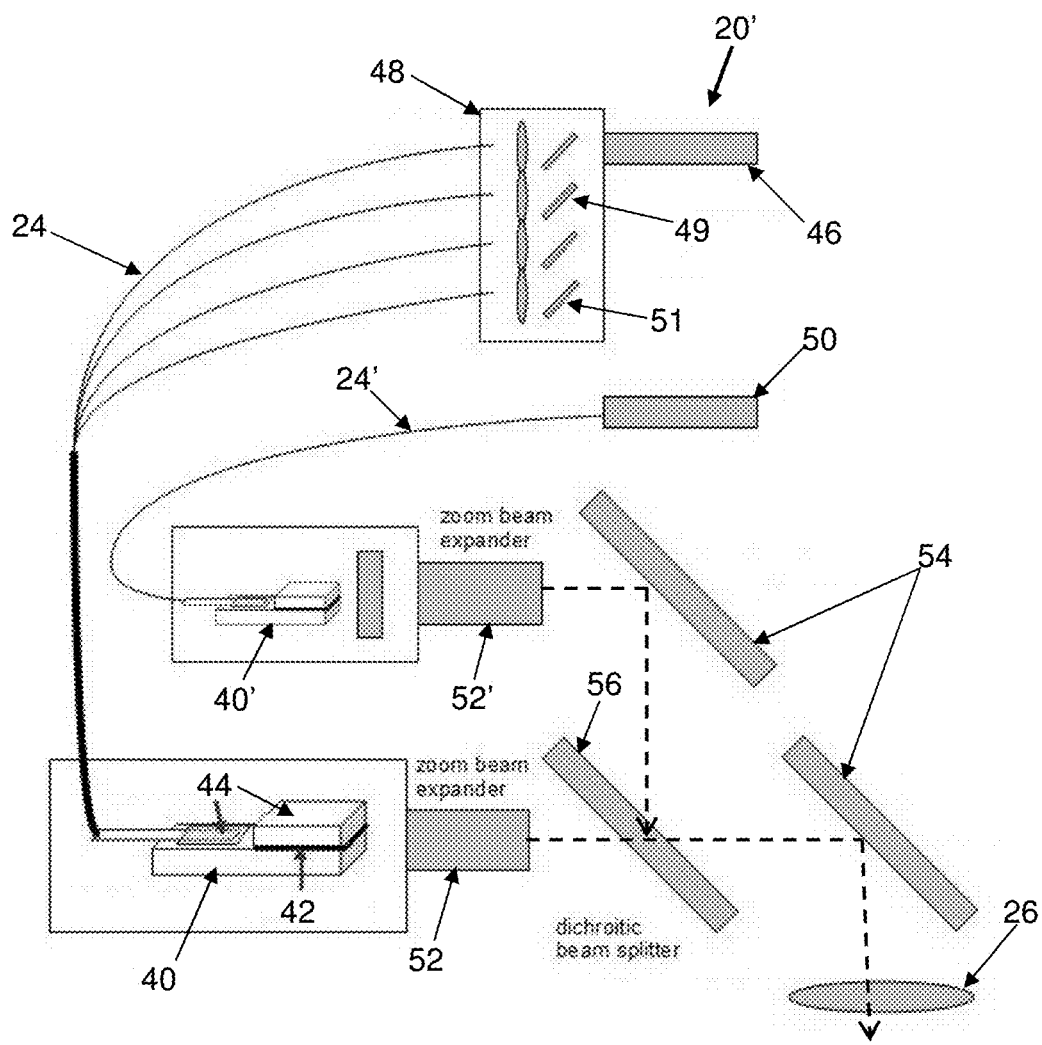
FIG. 3 is a schematic illustration of a laser fiber array according to a second preferred embodiment of the invention comprising two different types of laser sources.

FIG. 3 is a schematic illustration of a laser fiber array 20' according to a second preferred embodiment of the invention comprising two different types of laser sources 46, 50. Instead of a single type of laser L1-L5 comprised in the linear laser fiber array 20, the laser fiber array 20' may comprise a combination of different types of lasers, such as an ultraviolet laser 46 emitting laser beams having an ultraviolet wavelength at a first frequency combined with an infrared laser 50 emitting laser beams of an infrared wavelength at a second frequency.

The ultraviolet laser 46 is connected to an optical fiber coupling assembly 48 which splits an output of the ultraviolet laser 46 into multiple split laser beams.

The optical fiber coupling assembly 48 comprises beam splitters 49 and a mirror 51. The optical fiber coupling assembly 48 is connected to respective optical fibers 24, each of which is coupled to a separate split laser beam, which are secured to a fixture containing grooves 42 at their output ends. The optical fibers 24 are secured to the fixture 40 by adhesives and a cover 44.

The infrared laser 50 is connected to an optical fiber 24' which is secured to a separate fixture 40'. Outputs from the respective optical fibers 24, 24' are passed through respective zoom beam expanders 52, 52' to adjust the laser beams outputs. The output from the optical fiber 24' connected to the infrared laser 50 is reflected by a mirror to a dichroitic beam splitter 56. Meanwhile, the output from the optical fibers 24 connected to the ultraviolet laser 46 is passed through the dichroitic beam splitter 56. The laser beams generated by the ultraviolet and infrared lasers 46, 50 are thus merged into a single output path via the dichroitic beam splitter 56, are reflected by another mirror 54 and are then focused onto the semiconductor wafer 10 through the lens assembly 26.

With such an arrangement, different focal sizes of laser beams generated by the ultraviolet and infrared lasers are possible. Thus, it would be possible to simultaneously use an ultraviolet laser beam at high frequency for trenching, together with an infrared laser beam for grooving in a single pass.

Accordingly, such an apparatus enables multiple types or configurations of lasers to be set up, each laser being capable of having a different parameter (e.g. wavelength, pulse energy or pulse repetition rate) simultaneously in one cutting pass.

Although the described embodiment discloses a laser fiber array 20 that is linearly-arranged, it is also possible to arrange the laser fiber array two-dimensionally with a suitable fixture. Furthermore, one or more lasers L1-L5 may possess higher power than other lasers.

Figure 4:
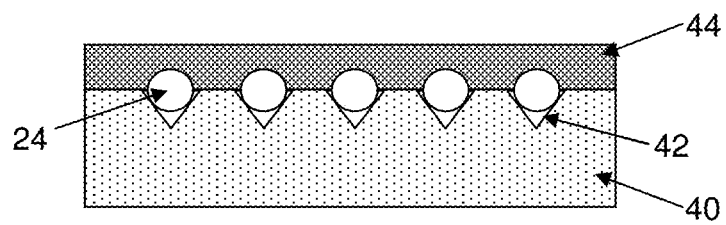
FIG. 4 is a cross-sectional view of optical fibers comprised in the laser fiber array that have been arranged on a fixture.

FIG. 4 is a cross-sectional view of optical fibers 24 comprised in the laser fiber array 20 wherein output ends of the optical fibers 24 have been arranged on a fixture 40. The fixture 40 has a planar surface, and a plurality of grooves 42 (which may be in the form of v-grooves) arranged in a generally planar orientation formed onto the planar surface of the fixture 40. The optical fibers 24 that lead out from the respective lasers L1-L5 are then laid onto the grooves 42 to position them in a desired arrangement with respect to one another. After arranging the optical fibers 24, the optical fibers 24 are secured by the cover 44 onto the fixture 40 to prevent further relative movement thereof.

Figure 5:
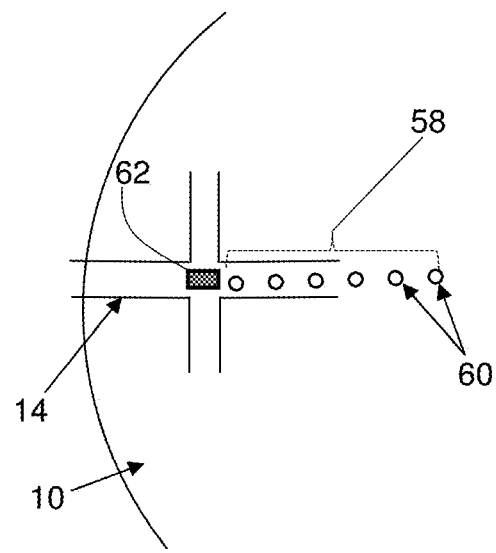
FIG. 5 is an illustration of a first exemplary cutting approach using the laser fiber array illustrated in FIG. 2.

FIG. 5 is an illustration of a first exemplary cutting approach using the laser fiber array 20 illustrated in FIG. 2. The laser fiber array 20 creates an array of laser spots 58 that is linearly arranged along a cutting line 14 on a semiconductor wafer 10 in order to cut the wafer. In this example, the array of laser spots 58 comprises six laser spots 60, although the number of laser spots may be varied by design.

When the linear array of laser spots 58 encounters an area along the cutting line 14 that is difficult to cut, such as a metallic test element group (TEG) 62, the laser power in respect of each laser spot 60 arriving at the TEG 62 can be increased at the position of the TEG 62. Hence, specific laser spots 60 that are positioned to impinge on the TEG 62 become more effective in cutting the TEG 62 with the increased power. Once an individual laser spot 60 has passed the position of the TEG 62, its laser energy can be reduced again to a normal processing power for cutting the wafer material.

Figure 6:
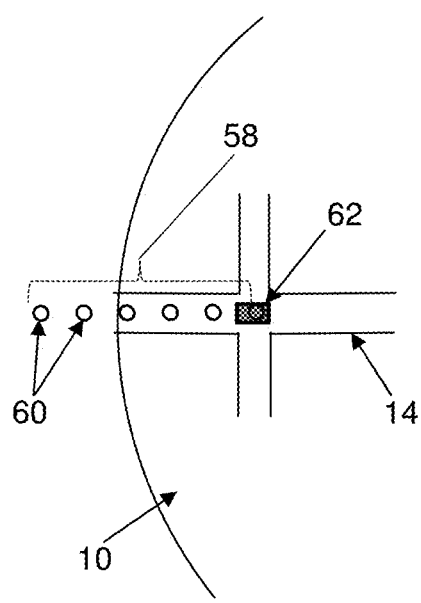
FIG. 6 is an illustration of a second exemplary cutting approach using the laser fiber array illustrated in FIG. 2.

FIG. 6 is an illustration of a second exemplary cutting approach using the laser fiber array 20 illustrated in FIG. 2. The linearly-arranged array of laser spots 58 has now almost entirely passed the position of the TEG 62.

When the array of laser spots 58 reach an edge of the semiconductor wafer 10, the laser spots 60 that extend beyond the edge of the semiconductor wafer 10 would now be impinging on dicing tape (not shown) that is supporting the semiconductor wafer 10. If necessary, such laser spots 60 arriving over the dicing tape may be switched off to prevent any damage to the dicing tape. Meanwhile, a full cut of the semiconductor wafer 10 along the cutting line 14 up to the edge of the wafer is achievable more accurately by virtue of the precise control that is possible.

It should be appreciated that the apparatus according to the described embodiments of the invention provide the delivery of laser beams to the semiconductor wafer 10 via an array of optical fibers which are configured to image a plurality of laser spots onto the semiconductor wafer 10. Expensive DOE systems using beam splitters and free space optics may therefore be avoided. The use of laser beam delivery through optical fibers 24 allows the flexible arrangement of the laser spots 60 that are used to cut the semiconductor wafer 10.

The enhanced flexibility enables real-time control of the properties of each laser beam comprised in multiple laser beams independently of one another. For instance, when the edge of the semiconductor wafer 10 is reached, each laser spot 60 that impinges upon the supporting dicing tape can be separately switched off while other laser spots 60 continue to cut the semiconductor wafer 10 to reduce the risk of damaging the dicing tape.

Moreover, where an area of the semiconductor wafer 10 that is difficult to cut such as a metallic test structure is reached, the power of a laser spot 60 located in that area can be increased to cut the area more effectively. With proper knowledge of the location of such areas, each laser spot 60 can ablate the semiconductor wafer 10 with higher power when hovering above the area to optimize the process parameters for ablating the same, without introducing unnecessary heat in relation to other areas that do not require such high power.

In this way, expensive high power ultraviolet lasers for grooving are replaceable with cheaper infrared lasers. Trenching may be performed with a comparatively cheaper ultraviolet laser which has more limited technical specifications to the level that would merely meet the demands for trenching. Trenching and grooving can also be performed during the same pass, leading to a fast single-pass grooving machine that is available at a lower cost.

Throughput improvement that is achievable at lower cost is also applicable to infrared laser singulation. For dicing applications, four passes are typically applied, as the last two passes are so-called "cleaning" passes to remove any remaining melt bridges. After the first two passes, a typical wafer should already be diced through. However, melt bridges are best removed at a high pulse repetition rate using small steps, while dicing requires a lower pulse repetition rate using larger steps. With the dicing method that is possible with the apparatus according to the preferred embodiment of the invention, one of the lasers may be operated at a high repetition rate, while other lasers are operated at lower repetition rates. Thus, multiple laser spots 60 with lower repetition rates are operable to dice the semiconductor wafer 10, while a laser spot 60 with a higher repetition rate subsequently removes melt bridges during the same pass. The said approach is possible using multiple infrared lasers that are operable at different pulse repetition rates and power per laser spot simultaneously. With this approach, throughput improvement by reducing of the number of required cutting passes is achievable.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for cutting a substrate, the apparatus comprising:

first and second lasers: and first and second optical fibers, each having an input end and an output end opposite to the input end, the input ends of the first and second optical fibers being connected to the first and second lasers respectively;

one or more additional lasers and one or more optical fibers having input ends connected respectively to the one or more additional lasers, such that a combined output from the optical fibers forms a horizontal array of laser spots along a cutting line of the substrate; and a controller system configured to selectively activate or deactivate each laser such that operation of one laser is independent from another laser;

wherein the output ends of the first, second and one or more additional optical fibers are movable relative to the substrate and are configured to image first, second and one or more additional laser beams onto the substrate simultaneously for cutting the substrate, wherein the apparatus is configured to switch off a laser spot of the horizontal array that extends beyond an edge of the substrate in use, wherein the first laser generates a laser beam of a different wavelength or at a different frequency from that generated by the second laser, and wherein the first laser is an infrared laser and the second laser is an ultraviolet laser.

2. The apparatus as claimed in claim 1, wherein the controller system includes.

3. The apparatus as claimed in claim 1, wherein the laser beam output from the first and second lasers are merged and focused onto different points on the substrate at the same time via a lens assembly.

4. The apparatus as claimed in claim 1, further comprising an objective lens assembly having a dual-wavelength anti-reflection coating for imaging laser beams generated from the lasers onto the substrate.

5. The apparatus as claimed in claim 1, wherein the combined output from the optical fibers forms a linear array of laser spots on the substrate.

6. The apparatus as claimed in claim 1, wherein the first laser comprises the same type of laser as the second laser.

7. The apparatus as claimed in claim 6, wherein the first and second lasers comprise DPSS q-switch lasers.

8. The apparatus as claimed in claim 1, wherein an output of the first and/or second laser is further divided into multiple split laser beams, each of the multiple split laser beams being coupled to a separate optical fiber.

9. The apparatus as claimed in claim 8, further comprising an optical fiber coupling assembly comprising at least a beam splitter and a mirror,
wherein each of the separate optical fibers is attached to the optical fiber coupling assembly for receiving each of the multiple split laser beams.

10. The apparatus as claimed in claim 1, further comprising a fixture to which the output ends of the optical fibers are secured for fixing the relative positions of the output ends of the optical fibers relative to each other.

11. The apparatus as claimed in claim 10, wherein the fixture contains:
a plurality of grooves arranged in a generally planar orientation, and
a cover configured to secure the output ends of the optical fibers into the grooves to prevent further relative movement thereof.

* * * * *